United States Patent [19]

Briglia

[11] 4,184,188
[45] Jan. 15, 1980

[54] SUBSTRATE CLAMPING TECHNIQUE IN IC FABRICATION PROCESSES

[75] Inventor: Donald D. Briglia, Los Altos, Calif.

[73] Assignee: Veeco Instruments Inc., Plainview, N.Y.

[21] Appl. No.: 869,523

[22] Filed: Jan. 16, 1978

[51] Int. Cl.² ............................................. H02N 13/00
[52] U.S. Cl. .............................. 361/234; 269/321 WE
[58] Field of Search .................... 361/230, 234; 269/8, 269/289 R, 329 WE; 250/443, 492 A

[56] References Cited

U.S. PATENT DOCUMENTS

| | | | |
|---|---|---|---|
| 2,897,424 | 7/1959 | Waring | 361/234 |
| 3,150,678 | 9/1964 | Nuber | 269/8 |
| 3,197,682 | 7/1965 | Klass et al. | 361/234 |
| 3,634,740 | 1/1972 | Stevko | 361/234 |
| 3,916,270 | 10/1975 | Wachtler et al. | 361/234 |

Primary Examiner—J D Miller
Assistant Examiner—L. C. Schroeder
Attorney, Agent, or Firm—Morgan, Finnegan, Pine, Foley & Lee

[57] ABSTRACT

An electrostatic clamping technique for use in clamping substrates in various semiconductor fabrication processes is disclosed. One example takes the form of a substrate support plate which has deposited on its working face two layers of thermally conductive, electrically insulative RTV silicone, between which layers is located an interdigital type printed circuit capacitor energized by a DC source in the kilovolt range. Secured to the back surface of the support plate is a water cooled jacket with the entire assembly adapted for location in the incident ion beam and having good thermal dissipation properties.

An alternate embodiment utilized an alumina support plate on which the capacitor of aluminum composition is deposited by vacuum evaporation; the exposed capacitor surface is rendered insulative by oxidation.

11 Claims, 3 Drawing Figures

SUBSTRATE CLAMPING TECHNIQUE IN IC FABRICATION PROCESSES

BACKGROUND

In a typical semiconductor micro-fabrication process, e.g., an ion beam etching operation, a substrate is processed by radiation in a high vacuum chamber. For example, the substrate may be etched for which purpose it is often coated with a photoresist pattern such that the areas to be etched are devoid of the photoresist material which thus functions as a stencil. The substrate (which may be conductive, semiconductive or insulative) is then mounted on a support and exposed in a high vacuum to the ion beam which is controlled to etch or mill away the exposed areas of the substrate to a desired depth.

One problem limiting the use of this technique is related to the danger of thermally caused degradation of the photoresist layer. This problem requires in many applications the use of a water cooled substrate support serving as a heat sink. In such an arrangement it becomes necessary to insure good thermal conductivity between the substrate being processed and the water cooled support. It is a common expedient to provide this conductivity by use of a grease which thereby provides a thermally conductive path of substantially greater cross sectional area than would otherwise obtain in an essentially three point contact between the substrate and the support to which it is attached.

While the use of grease is an acceptable procedure in laboratory type applications, it constitutes a limitation where production ion-etching and other production ion beam processes are desired.

One proposed amelioration of the problem is described in British Patent Specification No. 1,443,215. In that reference an electrostatic clamping arrangement is disclosed wherein a wafer or other object to be exposed to an ion beam or other radiation is secured to its support by the use of an electrostatic field.

To establish the field a voltage source is connected between the support and the substrate or wafer to be treated.

This approach (and a related one shown in Wardly, Electrostatic Wafer Chuck for Electron Beam Microfabrication, 1506 *Rev. Sci. Instrum.*, Vol. 44, No. IV, October 1973), appears to have two disadvantages in some applications. First of all it requires making electrical contact with the substrate being treated. Secondly, the mode of creating the electrostatic field can cause interference with the beam process (ion, electron or other radiation) in certain circumstances. In some cases this interference can be overcome but this can require additional connections between the ion beam grid system and the support and voltage supply.

OBJECTS

It is accordingly an object of the invention to provide a substrate clamping technique which does not require electrical contact with the wafer substrate or other element being processed and which also does not complicate the beam forming and controlling system.

It is a further object of the invention to provide a system which is particularly amenable to mass production techniques because it does not depend upon the use of potentially contaminating grease nor on the need to make electrical contact with the wafers being processed.

SUMMARY OF THE INVENTION

The invention which achieves these objects, and other objects apparent in the following description and in the practice of the invention, may be summarily and generally characterized as a substrate clamp comprising a thermally conductive support, multi-electrode capacitor means incorporated in the support and having at least two terminals for connection to a voltage source, and electrically insulative, thermally conductive means oriented to insulate said capacitor from said substrate, while providing thermal conductivity between them.

THE DRAWINGS

Serving to illustrate an exemplary embodiment of the invention are the drawings of which:

DESCRIPTION OF PREFERRED EMBODIMENT

Figure 1:
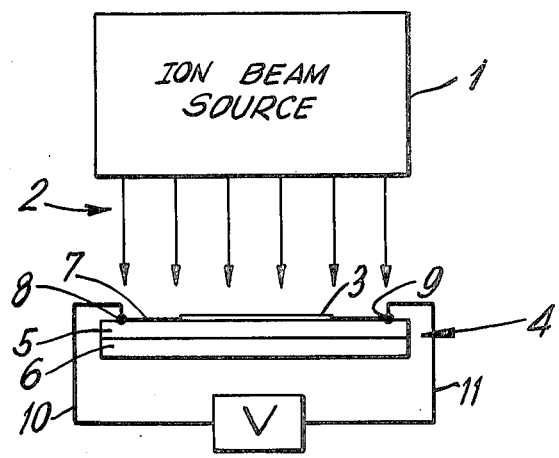
FIG. 1 is a schematic elevational view illustrating the electrostatic clamp of the invention in an ion beam high vacuum system, it being understood that the invention will serve in other applications as well.

The system schematically illustrated in FIG. 1 comprises an ion beam etching system which includes an ion beam source 1 for generating an ion beam 2 which is incident on a substrate 3 of semiconductive material such as silicon. The substrate 3 is mounted on a support 4 which includes an electrostatic plate 5 and connected thereto and in good thermal contact therewith, a water cooled plate or jacket 6.

Incorporated on the incident surface of electrostatic plate 5 is a printed circuit capacitor 7 having electrical terminals 8 and 9 which are connected via respective leads 10 and 11 to a source of DC voltage, V.

FIG. 1 illustrates the electrostatic clamp in an ion beam etching function, the source 1 including the usual grid structures, e.g. electron suppression and ion acceleration grids, as well as an exit grid, neutralization grid and any other required beam controlling electrodes. The source 1 also includes an anode and hot cathode and may include a magnetic field for imparting epicycloidic trajectories to the emitted electrons.

The ion source 1 also includes a source of gas such as neon, and the entire system is enclosed within a high vacuum chamber. Examples of ion beam etching systems are found in microetch systems sold by the assignee herein, Veeco Instruments Inc. (ion source 0313-901, power supply 0313-310; automatic pumping station VE 747).

Figure 2:
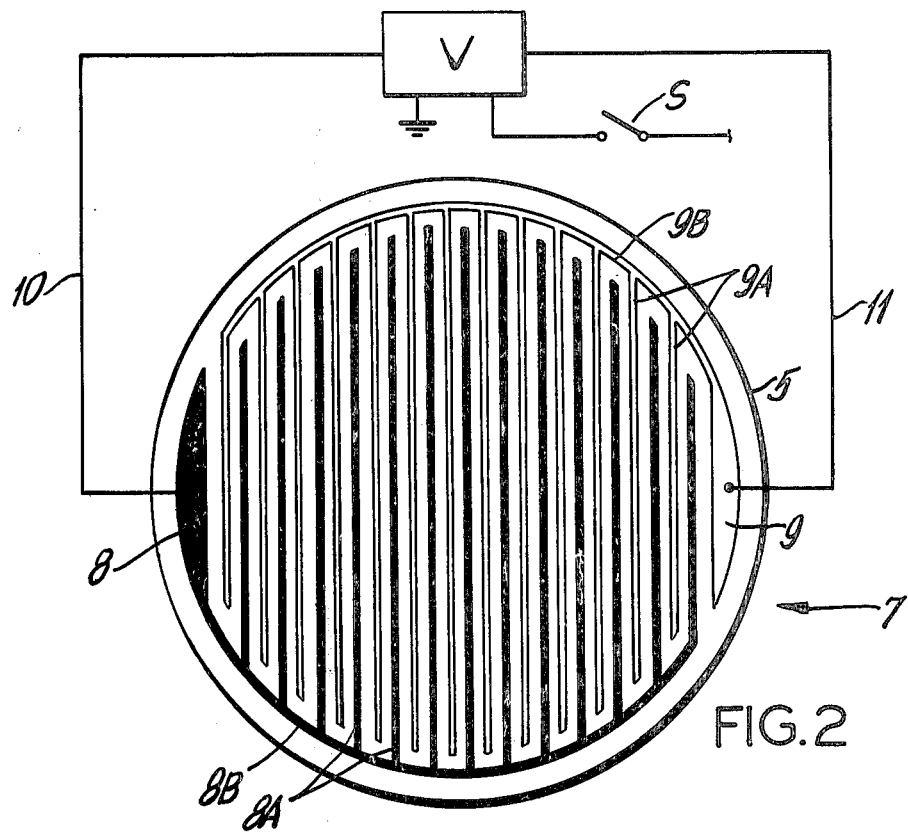
FIG. 2 is a schematic plan view of the electrostatic clamp on an enlarged scale.
Figure 3:
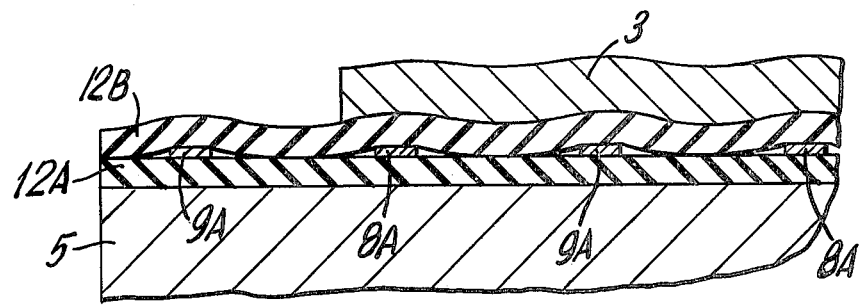
FIG. 3 is a schematic elevational and partly sectional view of the clamp with a substrate mounted thereon, on a still larger scale.

Further details of the printed capacitor 7 are shown in FIGS. 2 and 3. As shown therein the capacitor is of the printed circuit interdigital type and includes a first set of electrodes 8A connected to capacitor terminal 8 by way of a peripheral arcuate conductor segment 8B. Similarly, the oppositely polarized electrodes 9A are interdigitated with the plates 8A, and are connected by a printed arcuate segment 9B to capacitor terminal 9.

A suitable material for forming the conductor pattern of the capacitor is Eccocoat CC2 silver spray sold by the Emerson and Cuming Company. In the exemplary embodiment the printed circuit pattern is in the order of about 1 mil thickness.

As shown in FIG. 3, the printed circuit pattern is sandwiched between a pair of layers 12A and 12B, the former being coated on the outer surface of plate 5. Each of the layers 12A and 12B is, in the exemplary embodiment, of a thickness of about 4 mils and is comprised of an electrically insulative, thermally conductive material. The preferred composition is a thermally conductive RTV silicone such as is marketed under the designation Eccosil 4952, sold by the Emerson and Cuming Company.

As previously noted, the plate 5 is secured both mechanically and with good thermal conductivity, to the water cooled plate 6. To now insure good thermal conductivity between the substrate 3 being processed and the water cooled plate, the printed circuit capacitor 7 is energized to create an electrostatic field which brings substrate 3 into good thermal contact with outer layer 12B.

Since layer 12B is in intimate contact with layer 12A which is in turn in good thermal contact with plate 5, and since the latter is in good thermal conductivity with water cooled base 6, excellent temperature control is achievable. A voltage appropriate in the illustrated embodiment for achieving the requisite contact is in the neighborhood of about 1.5 kilovolts.

As shown in FIG. 2, the voltage source which supplies the charge to capacitor 7 may be switched by use of switch S such that opening the switch disconnects the voltage source from the capacitor and discharges the latter thereby permitting release of the wafer being treated.

In an alternate embodiment the support plate 5 may be fabricated of a thermally conductive electrical insulator such as alumina on which the capacitor 7 is deposited as by silk screening or vacuum evaporation. The need for layer 12A can thus be obviated.

By forming capacitor 7 from aluminum, e.g., by vacuum evaporation, and then oxidizing the exposed capacitor surface to form a thermally conductive, insulative layer, the layer 12B can also be excluded.

The substrates which may be held in place by the electrostatic clamp may be conductive, semi-conductive, or electrically polarizable insulative devices. It should also be understood that one of the terminals of the capacitor may be a grounded conductive surface or joint.

What is claimed is:

1. A clamp for supporting a substrate for use in semiconductor fabrication systems comprising a thermally conductive electrically insulative support, multi-electrode capacitor means mounted on the support to establish an electric field and having at least two terminals for connection to a voltage source, and thermally conductive means oriented to electrically insulate said capacitor means from said substrate while providing thermal conductivity therebetween.

2. The clamp as defined in claim 1 in which said thermally conductive means comprise thermally conductive coating.

3. The clamp as defined in claim 1 in which said thermally conductive means comprise an oxide coating on said capacitor means.

4. The clamp as defined in claim 1 in which said support comprises an electrically conductive metallic layer coated with a thermally conductive silicon material.

5. The clamp as defined in claim 1 in which said support comprises a plate fabricated of an electrically insulative, thermally conductive material.

6. The clamp of claim 5 in which said material is alumina.

7. The clamp of claim 6 in which said capacitor means are comprised of aluminum and in which said thermally conductive means comprise an oxide coating on said capacitor means.

8. The clamp as defined in claim 1 in which said capacitor means comprise an interdigital capacitance.

9. The clamp as defined in claim 1 in which said thermally conductive means comprise a pair of layers between which is sandwiched said multi-electrode capacity means.

10. The clamp as defined in claim 1 in which the electrodes of said capacitor means are in the order of about 1 mil thickness.

11. The clamp as defined in claim 5 in which said thermally conductive means comprise two layers of thermally conductive material, each of approximately 4 mils thickness and between which said multi-electrode capacitor means is located.

* * * * *

UNITED STATES PATENT AND TRADEMARK OFFICE
CERTIFICATE OF CORRECTION

PATENT NO. : 4,184,188
DATED : January 15, 1980
INVENTOR(S) : Donald D. Briglia

It is certified that error appears in the above-identified patent and that said Letters Patent are hereby corrected as shown below:

In Column 4, line 21, "silicon" should correctly read -- silicone --.

Signed and Sealed this

Twenty-fifth Day of March 1980

[SEAL]

Attest:

SIDNEY A. DIAMOND

Attesting Officer

Commissioner of Patents and Trademarks